(12) United States Patent
Chien et al.

(10) Patent No.: US 11,513,340 B2
(45) Date of Patent: Nov. 29, 2022

(54) PROJECTOR

(71) Applicant: Qisda Corporation, Taoyuan (TW)

(72) Inventors: Chih-Shiung Chien, Taoyuan (TW);
Ming-Kuen Lin, Taoyuan (TW);
Tsung-Hsun Wu, Taoyuan (TW)

(73) Assignee: Qisda Corporation, Taoyuan (TW)

(*) Notice: Subject to any disclaimer, the term of this patent is extended or adjusted under 35 U.S.C. 154(b) by 457 days.

(21) Appl. No.: 16/669,122

(22) Filed: Oct. 30, 2019

(65) Prior Publication Data

US 2020/0132982 A1 Apr. 30, 2020

(30) Foreign Application Priority Data

Oct. 31, 2018 (CN) .......................... 201811282084.7

(51) Int. Cl.
| | |
|---|---|
| *G02B 26/00* | (2006.01) |
| *G02B 26/08* | (2006.01) |
| *G02B 5/04* | (2006.01) |
| *G03B 21/00* | (2006.01) |
| *G03B 21/20* | (2006.01) |

(52) U.S. Cl.
CPC ......... *G02B 26/0833* (2013.01); *G02B 5/045* (2013.01); *G03B 21/008* (2013.01); *G03B 21/2066* (2013.01); *B81B 2201/042* (2013.01)

(58) Field of Classification Search
CPC ................ G02B 26/0833; G02B 5/045; G03B 21/008; G03B 21/2066; B81B 2201/042

USPC .................................................. 359/290, 649
See application file for complete search history.

(56) References Cited

U.S. PATENT DOCUMENTS 5,552,922 A * 9/1996 Magarill ............ G02B 26/0883
359/833

FOREIGN PATENT DOCUMENTS

| CN | 1797177 A | 7/2006 | |
|---|---|---|---|
| CN | 101673036 A | 3/2010 | |
| CN | 106292146 A | 1/2017 | |
| WO | WO-2011030436 A1 * | 3/2011 | ........... G02B 27/285 |

* cited by examiner

*Primary Examiner* — William Choi

(57) ABSTRACT

A projector including a light source, a first prism, a second prism and a digital micro-mirror device (DMD) is provided. The light source emits light. The first prism includes a first surface, a second surface and a third surface which are connected to each other around the perimeter thereof, and the illumination light enters the first prism through the first surface. The second prism has a fourth surface and a fifth surface which are connected to each other, and the fourth surface faces the second surface of the first prism. The DMD faces the third surface. The illumination light sequentially passes through the first surface, is reflected by the second surface, passes through the third surface, and reaches the DMD. The DMD converts the illumination light into image light, and the image light sequentially passes through the third surface, the second surface, the fourth surface and the fifth surface. In the first prism, a first included angle between the first surface and the third surface is more than or equal to 105 degrees.

10 Claims, 3 Drawing Sheets

PROJECTOR

BACKGROUND

Technical Field

The present invention relates to a projector, and particularly relates to a projector using two prisms.

Related Art

In an existing projector, a total internal reflection (TIR) prism can be configured to transmit light to a digital micromirror device (DMD) in the digital light processing (DLP) projection technology. The DMD processes the received light according to received information, reflects the processed light into image light, and then transmits the image light to a projection screen through a projection lens to form an image. Since the DMD can digitize the received light, it can not only directly carry out digitization according to digital image information, but also provide high-quality images. Therefore, how to improve a projector using the above technology is one of objectives of current efforts.

SUMMARY

The present invention provides a projector, which can reduce a back focal length of a projection lens.

The projector of the present invention includes a light source, a first prism, a second prism and a digital micromirror device (DMD). The light source emits illumination light. The first prism includes a first surface, a second surface and a third surface which are connected to each other around the perimeter thereof, and the illumination light enters the first prism through the first surface. The second prism includes a fourth surface and a fifth surface which are connected to each other, and the fourth surface faces the second surface of the first prism. The DMD faces the third surface. The illumination light sequentially passes through the first surface, is reflected by the second surface, passes through the third surface, and reaches the DMD. The DMD converts the illumination light into image light, and the image light sequentially passes through the third surface, the second surface, the fourth surface and the fifth surface. In the first prism, a first included angle between the first surface and the third surface is more than or equal to 105 degrees.

In one embodiment of the present invention, a ratio of the thickness of the second prism to the thickness of the first prism is more than or equal to 0.54 and less than or equal to 1 in a first direction. The first direction is parallel to a normal vector of the third surface.

In one embodiment of the present invention, the DMD includes a reflection surface which is substantially parallel to the third surface of the first prism.

In one embodiment of the present invention, the projector also includes a projection lens. The projection lens includes a light entering end and a light exiting end. The light entering end is configured to receive the image light from the fifth surface, and the image light enters the projection lens from the light entering end and then is emitted from the light exiting end. The third surface of the first prism is substantially parallel to the fifth surface of the second prism. The third surface is separated from the fifth surface by a first distance, and the reflection surface is separated from the light entering end by a second distance. A ratio of the first distance to the second distance is more than or equal to 0.53 and less than or equal to 0.99.

In one embodiment of the present invention, the DMD is a tilt & roll DMD.

In one embodiment of the present invention, a second included angle is formed between a main optical axis of the illumination light and the normal vector of the first surface of the first prism, and the projector also includes an optical path compensation device. The optical path compensation device is disposed between the light source and the first surface of the first prism. The illumination light is transmitted to the first surface through the optical path compensation device.

In one embodiment of the present invention, the optical path compensation device includes a light exiting surface. The illumination light enters the optical path compensation device and then is emitted from the light exiting surface. A third included angle is formed between the normal vector of the light exiting surface and the main optical axis of the illumination light.

In one embodiment of the present invention, the optical path compensation device, the light source and the first prism are substantially arranged along an axial line. The main optical axis of the illumination light emitted by the light source is substantially parallel to the axial line, and the projector conforms to:

$\theta 2 = \theta 3 \times G$;

$\theta 2$ is the second included angle; $\theta 3$ is the third included angle; and $1.6 \leq G \leq 1.9$.

In one embodiment of the present invention, the optical path compensation device, the light source and the first prism are substantially arranged along an axial line. The main optical axis of the illumination light emitted by the light source is substantially parallel to the axial line. The first surface has a first end close to the DMD and a second end away from the DMD in the first direction, and the light exiting surface has a third end close to the DMD and a fourth end away from the DMD in the first direction. In a second direction perpendicular to the first direction, the first end is far away from the light source relative to the second end, and the fourth end is far away from the light source relative to the third end. The second direction is perpendicular to the normal vector of the DMD.

In one embodiment of the present invention, the optical path compensation device includes a plano-convex lens having a plane connected to the first surface of the first prism.

It can be known from the above disclosure that the projector provided by the present invention can shorten the back focal length of the projection lens via the first prism and the second prism, so as to improve the overall manufacturing efficiency.

DETAILED DESCRIPTION

A projector provided by the present invention can use a projection lens having a relatively shorter back focal length, i.e., a projection lens having a relatively shorter distance from a vertex of the last optical surface of the projection lens to a back focus (with respect to a plurality of optical devices in front of it). The projector can be applied to a digital light processing (DLP) projection system, and is preferably a projector having a total internal reflection (TIR) prism, a digital micro reflector, a tilt & roll pixel DLP pico chipset (TRP DLP® Pico™ Chipset), but the present invention is not limited to the above application field.

It should be understood that although terms such as "first" and "second" in this specification may be used for describing various elements, components, or parts, the elements, components, or parts are not limited by such terms. The terms are only used to distinguish one element, component, or part. Therefore, the "first element", "the first direction", "the first surface", "the first angle" or "the first part" described below may also be referred to as a "second element", "a second direction", "a second surface", "a second angle" or "a second part" without departing from the teachings of this specification.

Detailed technical features of a protector provided by the present invention will be described below by a plurality of embodiments respectively.

Figure 1A:
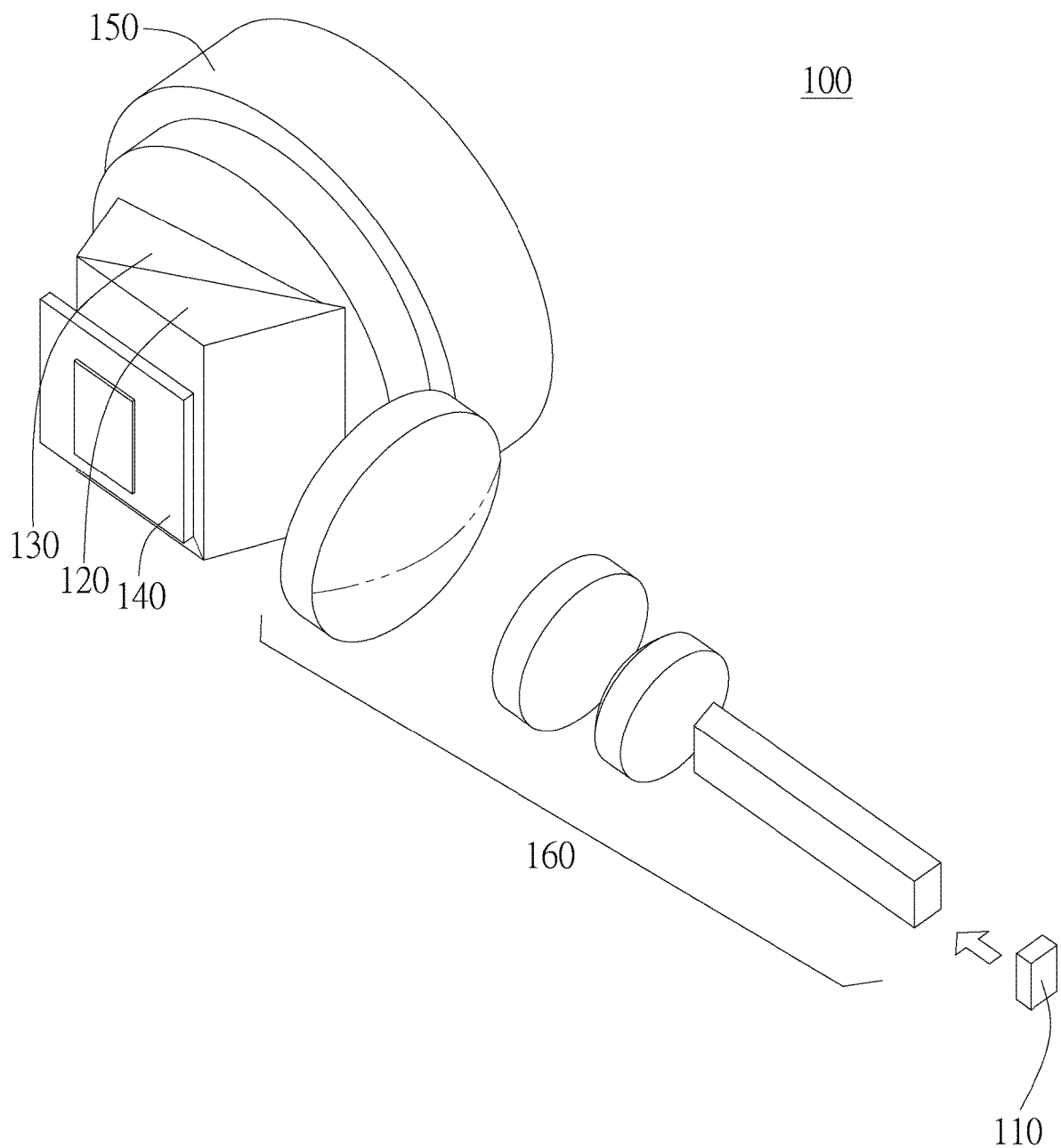
FIG. 1A is a perspective diagram of a projector according to a first embodiment of the present invention.

FIG. 1A is a perspective diagram of a projector according to a first embodiment of the present invention. Referring to FIG. 1A, in the present embodiment, the projector 100 includes a light source 110, a first prism 120, a second prism 130 and a digital micro-mirror device (DMD) 140. Specifically, the projector 100 may also include an optical device 160 for adjusting a light beam. The optical device 160 is, for example, composed of lenses and optical integrators, but the present invention is not limited thereto. A prism set composed of the first prism 120 and the second prism 130 may receive illumination light from the light source 110 and transmit it to the DMD 140 through total reflection. The DMD 140 converts the illumination light into image light and sends it out through the prism set to form an image. For example, the image is projected to a projection screen through a projection lens 150. In the projector 100 of the present embodiment, the first prism 120 has a relatively large interior angle, so that the thickness of the prism set composed of the first prism 120 and the second prism 130 may be reduced.

Figure 1B:
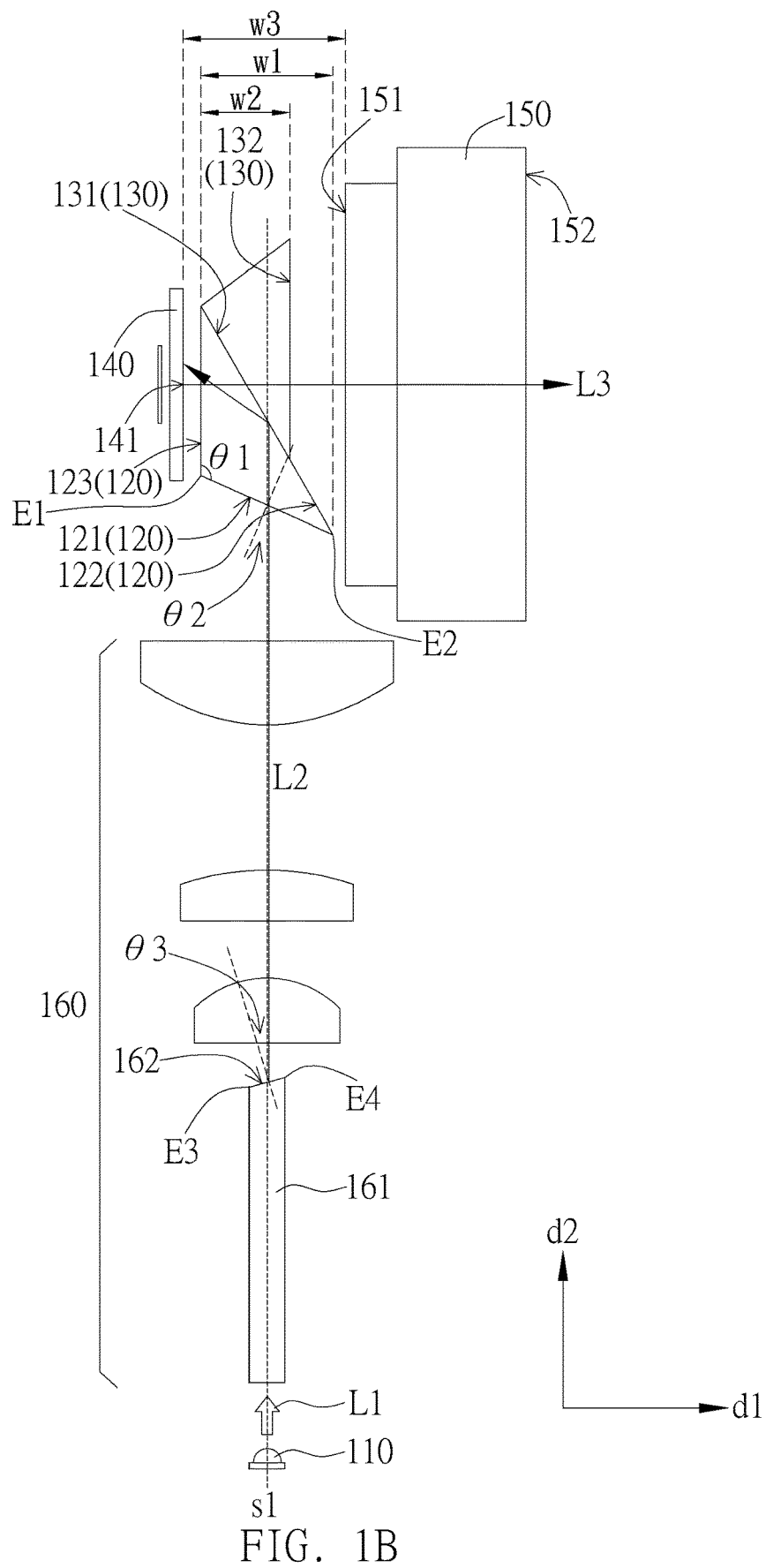
FIG. 1B is a schematic diagram of the projector according to the first embodiment of the present invention.

FIG. 1B is a planar schematic diagram of the projector according to the first embodiment of the present invention. Specifically, referring to FIG. 1B, after the illumination light L1 from the light source 110 is processed into illumination light L2 through part of the optical device 160, the illumination light L2 enters the first prism 120 from a first surface 121. After entering the first prism 120, the illumination light L2 is totally reflected by a second surface 122 to a third surface 123 and transmitted to the DMD 140. A first included angle θ1 between the first surface 121 and the third surface 123 is more than or equal to 105 degrees.

In the present embodiment, the DMD 140 is, for example, a tilt & roll pixel DLP pico chipset, which faces the third surface 123 and suitable for digitally processing the illumination light L2 into image light L3. The image light L3 sequentially passes through the third surface 123 and the second surface 122 of the first prism 120 from the DMD 140, then passes through a fourth surface 131 and a fifth surface 132 of the second prism 130, and reaches the projection lens 150 to project an image.

Since the first included angle θ1 in the first prism 120 of the present embodiment is more than or equal to 105 degrees, the thickness of the prism set composed of the first prism 120 and the second prism 130 may be reduced, and a distance between the projection lens 150 and the DMD 140 may be shortened. Therefore, the projection lens 150 may be one having a relatively shorter back focal length.

Because the projection lens 150 with the relatively shorter back focal length is relatively easy to produce and the number of lenses used may also be reduced, the yield of the lens is increased and the cost is reduced. Therefore, the yield of the projector 100 of the present embodiment can be increased.

In detail, referring to FIG. 1B again, in a first direction d1, a ratio, namely w2/w1, of the thickness w2 of the second prism 130 to the thickness w1 of the first prism 120 is more than or equal to 0.54 and less than or equal to 1. The back focal length of the projection lens 150 may be shortened by the first prism 120 having the first included angle θ1 and a relative position arrangement between the first prism 120 and the second prism 130. For example, if the TIR prism in the related art does not have the technical features of the above-mentioned first included angle θ1, the thickness ratio of the two corresponding prisms will be more than or equal to 0.76 and less than or equal to 1. The thickness of the prism close to the projection lens may account for a relatively large proportion, and the back focal length of the projection lens is thus not shortened, either. Since the first prism 120 of the present embodiment has the first included angle θ1, the second prism 130 has a relatively small thickness, and the back focal length of the projection lens is reduced.

Further, in the first direction d1, a ratio, namely w2/w3, of a distance (i.e., the thickness w2 of the second prism 130) between the third surface 123 and the fifth surface 132 which are substantially parallel to each other to a distance w3 between a light entering end 151 of the projection lens 150 to a reflection surface 141 of the DMD 140 in the present embodiment is more than or equal to 0.53 and less than 1. The light entering end 151 of the projection lens 150 is configured to receive the image light L3, and the image light L3 enters the projection lens 150 and then is emitted from a light exiting end 152. It can be known from the above disclosure that the prism set of the present embodiment can shorten the distance between the projection lens 150 and the reflection surface 141, that is, the projection lens 150 may be the one having the shorter back focal length. As mentioned above, if the TIR prism in the related art does not have the technical features of the above-mentioned first included angle θ1, the ratio of the thickness of the prism close to the projection lens to the distance between the DMD and the projection lens will be more than or equal to 0.76 and less than 1, and the thickness of the prism close to the projection lens may account for a relatively large proportion, so that the back focal length of the projection lens cannot be shortened.

The reflection surface 141 of the DMD 140 is substantially parallel to the third surface 123. The DMD 140 is preferably a tilt & roll DLP chipset, and a flip angle of its micro-mirror is up to 17 degrees to achieve relatively larger etendue (i.e., area multiplies flip angle), so more lights may be collected from the optical device 160 and transmitted to the projection lens 150.

On another aspect, the projector 100 of the present embodiment also includes an optical path compensation device, located between the light source 110 and the first surface 121 of the first prism 120, and configured to compensate for an optical path difference caused by tilting of the first surface 121. Specifically, the optical path compensation device of the present embodiment is, for example, composed of an optical integration device 161 and a light exiting surface 162 thereof. The optical integration device 161 is, for example, an optical integration column or an optical integration tube capable of performing internal reflection on the illumination light L1. The illumination light L1 enters the optical integration device 161 and then is emitted from the light exiting surface 162 as the illumination light L2 with uniform intensity.

In the present embodiment, a third included angle θ3 is formed between the normal vector of the light exiting surface 162 and a main optical axis s1 of the illumination light L1 emitted from the light source 110 to compensate for the optical path difference caused by the fact that the illumination light L2 enters the first surface 121 at an incidence angle θ2 (i.e., a second included angle θ2 is formed between the main optical axis s1 of the illumination light L1 and the normal vector of the first surface 121 of the first prism 120), so as to further ensure the quality of an image formed by the image light L3. Specifically, the projector 100 of the present embodiment conforms to:

θ2=θ3×G; and 1.6≤G≤1.9, which may preferably compensate for the optical path difference.

In other words, in the projector 100 of the present embodiment, the optical path compensation device (for example, composed of the optical integration device 161), the light source 110 and the first prism 120 are substantially arranged along the axial line s1. In the direction d2, the first end E1, close to the DMD 140 in the direction d1, of the first surface 121 is higher than the second end E2 away from the DMD 140, that is, a distance between the first end E1 of the first surface 121 and the light source 110 in the direction d2 is greater than a distance between the second end E2 and the light source 110 in the direction d2. In the direction d2, the third end E3, close to the DMD 140 in the direction d1, of the light exiting surface 162 is lower than the fourth end E4 away from the DMD 140, that is, a distance between the third end E3 of the light exiting surface 162 and the light source 110 in the direction d2 is less than a distance between the fourth end E4 and the light source 110 in the direction d2. Therefore, the optical path compensation device (for example, composed of the optical integration device 161) may appropriately compensate for the optical path difference after the light L2 enters the first prism 120.

Figure 2:
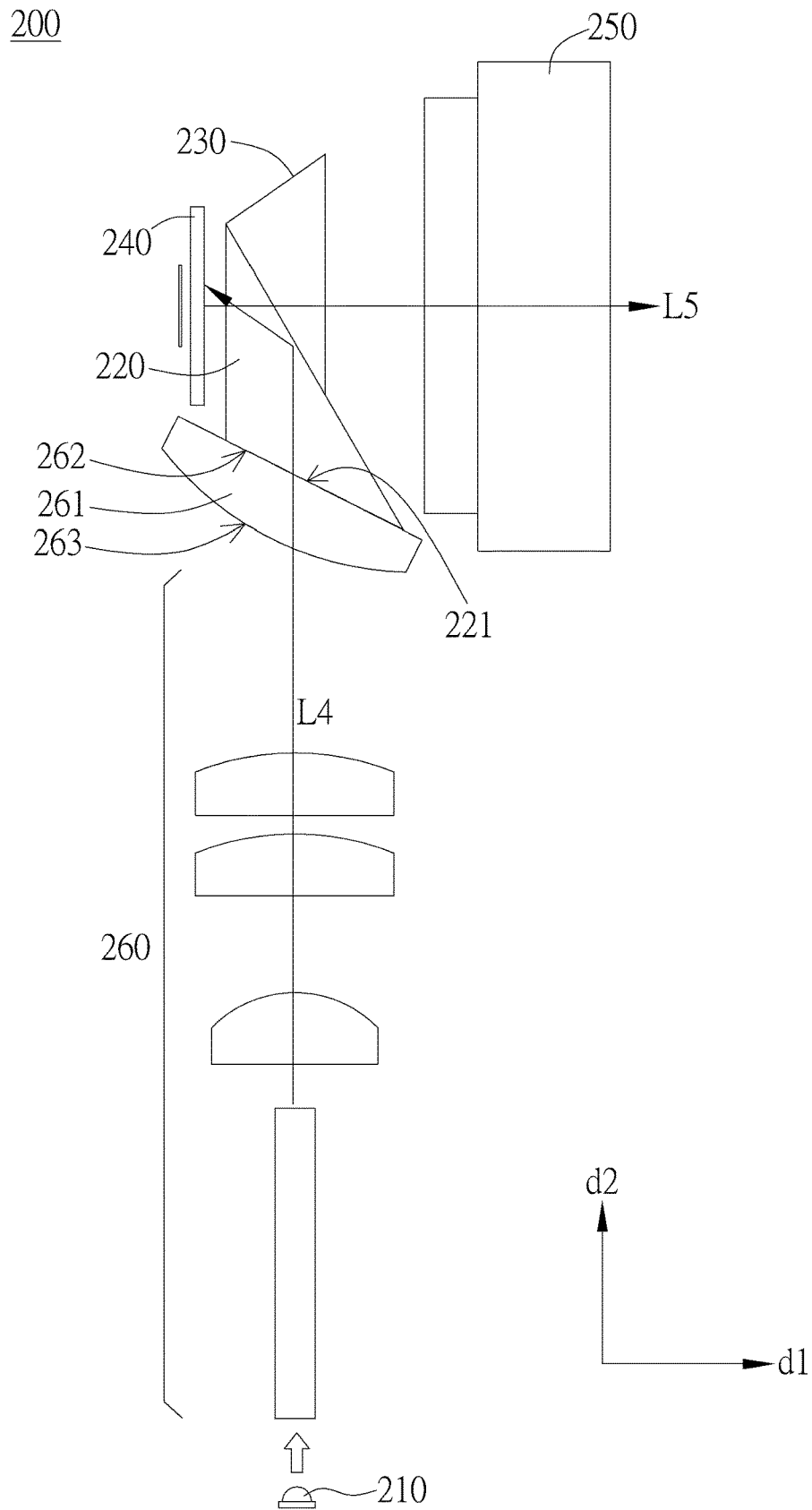
FIG. 2 is a schematic diagram of a projector according to a second embodiment of the present invention.

The optical path compensation device of the projector provided by the present invention is not limited to the above-mentioned optical path compensation device comprising the optical integration device 161, and may also be achieved by any kind of lens. FIG. 2 is a schematic diagram of a projector according to a second embodiment of the present invention. Referring to FIG. 2, the projector 200 is similar to the projector 100 of the first embodiment, and includes a light source 210, a first prism 220, a second prism 230, a digital micro-mirror device (DMD) 240, a projection lens 250 and an optical device 260. The most devices may approximately refer to the disclosure of the first embodiment, and descriptions thereof are omitted herein. A difference between the projector 200 of the present embodiment and the first embodiment is that the optical path compensation device of the present embodiment is achieved by a plano-convex lens 261 in the optical device 260. A plane 262 of the plano-convex lens 261 is connected to the first surface 221 of the first prism 220. A convex surface 263 faces the light source 210 to receive light L4. By the shape of the convex surface 263 and refraction of the plano-convex lens 261, the projector 200 of the present embodiment may also maintain the quality of an image formed by image light L5.

Based on the above, according to the projector provided by the present invention, the thicknesses of the first prism and the second prism can be reduced with the help of the obtuse angle design of the first prism, so that the distance between the projection lens and the DMD is shortened, and furthermore, the projection lens having the shorter back focal length can be applied to the projector.

REFERENCE NUMERALS

E1: first end
E2: second end
E3: third end
E4: fourth end
L1, L2, L4: light
L3, L5: image light
100, 200: projector
110, 210: light source
120, 220: first prism
121, 221: first surface
122: second surface
123: third surface
130, 230: second prism
131: fourth surface
132: fifth surface
140, 240: digital micro-mirror device (DMD)
141: reflection surface
150, 250: projection lens
151: light entering end
152: light exiting end
160, 260: optical device
161: light integration device
162: light exiting surface
261: plano-convex lens
262: plane
263: convex surface

What is claimed is:

1. A projector, comprising:
a light source, for emitting illumination light;
a first prism, comprising a first surface, a second surface and a third surface which are connected to each other around the perimeter thereof, wherein the illumination light enters the first prism through the first surface;
a second prism, comprising a fourth surface and a fifth surface which are connected to each other, wherein the fourth surface faces the second surface of the first prism;
a digital micro-mirror device (DMD), facing the third surface, wherein the illumination light sequentially passes through the first surface, is reflected by the second surface, passes through the third surface, and reaches the DMD; the DMD converts the illumination light into image light, and the image light sequentially passes through the third surface, the second surface, the fourth surface and the fifth surface; and
an optical path compensation device, disposed between the light source and the first surface of the first prism, wherein the optical path compensation device comprises a light exiting surface, and the illumination light enters the optical path compensation device and then is emitted from the light exiting surface to be transmitted to the first surface;
wherein, in the first prism, a first included angle between the first surface and the third surface is more than or equal to 105 degrees, and
wherein the first surface has a first end close to the DMD and a second end away from the DMD in a first direction parallel to a normal vector of the third surface, and the light exiting surface has a third end close to the DMD and a fourth end away from the DMD in the first direction; in a second direction perpendicular to the first direction, the first end is far away from the light source relative to the second end, and the fourth end is far away from the light source relative to the third end.

2. The projector according to claim 1, wherein a ratio of the thickness of the second prism to the thickness of the first prism is more than or equal to 0.54 and less than or equal to 1 in the first direction.

3. The projector according to claim 1, wherein the DMD comprises a reflection surface which is substantially parallel to the third surface of the first prism.

4. The projector according to claim 3, further comprising:
a projection lens, comprising a light entering end and a light exiting end, wherein the light entering end is configured to receive the image light from the fifth surface, and the image light enters the projection lens from the light entering end and then is emitted from the light exiting end; the third surface of the first prism is substantially parallel to the fifth surface of the second prism; the third surface is separated from the fifth surface by a first distance, and the reflection surface is separated from the light entering end by a second distance; and a ratio of the first distance to the second distance is more than or equal to 0.53 and less than 1.

5. The projector according to claim 3, wherein the DMD is a tilt & roll DMD.

6. The projector according to claim 3, wherein a second included angle is formed between a main optical axis of the illumination light and a normal vector of the first surface of the first prism.

7. The projector according to claim 6, wherein a third included angle is formed between a normal vector of the light exiting surface and the main optical axis of the illumination light.

8. The projector according to claim 7, wherein the optical path compensation device, the light source and the first prism are substantially arranged along an axial line; the main optical axis of the illumination light emitted by the light source is substantially parallel to the axial line, and the projector conforms to:

$\theta 2 = \theta 3 \times G$;

wherein $\theta 2$ is the second included angle; $\theta 3$ is the third included angle; and $1.6 \leq G \leq 1.9$.

9. The projector according to claim 7, wherein the optical path compensation device, the light source and the first prism are substantially arranged along an axial line; the main optical axis of the illumination light emitted by the light source is substantially parallel to the axial line; and the second direction is perpendicular to a normal vector of the DMD.

10. The projector according to claim 6, wherein the projector further comprises a plano-convex lens having a plane connected to the first surface of the first prism.

* * * * *